United States Patent
Distler et al.

(10) Patent No.: US 8,712,488 B2
(45) Date of Patent: Apr. 29, 2014

(54) LOW TEMPERATURE PRESSURE CHAMBER UNIT, MAGNETIC RESONANCE DEVICE WITH A LOW TEMPERATURE PRESSURE CHAMBER UNIT, AND AN ATTACHMENT METHOD TO ATTACH AT LEAST ONE ADD-ON UNIT TO AN EXTERNAL HOUSING OF A LOW TEMPERATURE PRESSURE CHAMBER UNIT

(75) Inventors: Peter Distler, Moehrendorf (DE); Bernd Maciejewski, Markt Erlbach (DE); Conny Patzak, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 89 days.

(21) Appl. No.: 13/444,988

(22) Filed: Apr. 12, 2012

(65) Prior Publication Data
US 2012/0264614 A1    Oct. 18, 2012

(30) Foreign Application Priority Data

Apr. 12, 2011    (DE) .......................... 10 2011 007 179

(51) Int. Cl.
*G01R 33/035*    (2006.01)

(52) U.S. Cl.
USPC .......................................................... 505/162

(58) Field of Classification Search
CPC ........... G01R 33/3802; G01R 33/3804; G01R 33/381; G01R 33/3815; H01F 6/00
USPC ......................................... 505/162, 163, 300
See application file for complete search history.

(56) References Cited

U.S. PATENT DOCUMENTS 5,570,021 A * 10/1996 Dachniwskyj et al. ........ 324/318
2004/0140806 A1   7/2004 Schuster et al.

OTHER PUBLICATIONS

"Flexible Template for Marking Positions in System Installations," Maciejewski et al., IP.com Journal, vol. 9, No. 9a (2009), p. 131.

* cited by examiner

*Primary Examiner* — Colleen Dunn
(74) *Attorney, Agent, or Firm* — Schiff Hardin LLP (57) ABSTRACT

In order to attach an add-on unit to a low temperature pressure chamber unit having a low temperature pressure chamber, and an external housing surrounding the low temperature pressure chamber, an attachment device is used to attach at least one add-on unit to the external housing, and the attachment device has an adhesive unit designed for the arrangement and/or attachment of the at least one add-on unit to the external housing.

25 Claims, 6 Drawing Sheets

LOW TEMPERATURE PRESSURE CHAMBER UNIT, MAGNETIC RESONANCE DEVICE WITH A LOW TEMPERATURE PRESSURE CHAMBER UNIT, AND AN ATTACHMENT METHOD TO ATTACH AT LEAST ONE ADD-ON UNIT TO AN EXTERNAL HOUSING OF A LOW TEMPERATURE PRESSURE CHAMBER UNIT

BACKGROUND OF THE INVENTION

1. Field of the Invention

The present invention concerns a low temperature pressure chamber unit with a low temperature pressure chamber, an external housing surrounding the low temperature pressure chamber, and an attachment device to attach at least one add-on unit to the external housing.

2. Description of the Prior Art

Low temperature pressure chamber units in magnetic resonance devices have a low temperature pressure chamber that has at least one magnetic coil that is borne within the low temperature pressure chamber at approximately −269° C. The low temperature pressure chamber is additionally borne within a vacuum chamber with a high vacuum that is surrounded by an external housing of the low temperature pressure chamber unit. An application of an attachment device to attach additional add-on units to the low temperature pressure chamber by attachment methods (for example a subsequent drilling and/or welding, etc.) is therefore possible only with significant time and material expense. In addition, these attachment methods can lead to an unwanted destabilization and or deformation of the low temperature pressure chamber unit.

In order to attach additional add-on units (for example casing modules and/or cable guide modules, etc.) to a low temperature pressure chamber, an attachment device is known that required a complicated construction, for example bolts and/or retaining clips and/or additional elements that are arranged on already-present attachment elements that are provided for a transport of the low temperature pressure chamber, for example. However, these already present attachment elements are often located far away from a desired and/or ideal attachment position for the additional add-on units, such that the add-on units are attached and thus located at a position on the low temperature pressure chamber that is disadvantageous for their functionality, and/or such that complicated frame constructions are required that are arranged around the low temperature pressure chamber in order to position the add-on units at a desired position.

SUMMARY OF THE INVENTION

An object of the present invention is to provide a low temperature pressure chamber unit that enables a fast and cost-effective attachment of additional add-on units at an arbitrary position on a low temperature pressure chamber.

The invention proceeds from a low temperature pressure chamber unit that has a low temperature pressure chamber, an external housing surrounding the low temperature pressure chamber, and an attachment device to attach at least one add-on unit to the external housing.

In accordance with the invention, the attachment device has an adhesive unit that is provided for an arrangement and/or an attachment of the at least one add-on unit to the external housing. The adhesive unit is arranged in spatial terms between the at least one add-on unit and the external housing. As used herein, a low temperature pressure chamber unit means a unit that is designed to withstand an overpressure or a negative pressure (a high vacuum) and that additionally maintains this overpressure or negative pressure at low temperatures, advantageously of less than −160° C., preferably of less than −250° C., and particularly preferably of approximately −269° C. inside the low temperature pressure chamber. The low temperature pressure chamber unit is particularly of the type used in magnetic resonance systems, wherein the low temperature pressure chamber unit is designed to accommodate a basic field magnet with magnetic coils within the low temperature pressure chamber. The low temperature pressure chamber unit usually has additional units in magnetic resonance systems, for example a vacuum chamber with a high vacuum, with the low temperature pressure chamber supported (mounted) within the vacuum chamber. This vacuum chamber is in turn surrounded by the external housing. Furthermore, as used herein, add-on unit means a unit that performs a function in outside of the low temperature pressure chamber unit, for example a retaining clip for casing modules, cable guide elements, a rear support for a patient bed, etc.

According to the invention, an additional add-on unit that is cost-effective and of simple design can be arranged at the low temperature pressure chamber unit, and an unwanted negative effect on the low temperature pressure chamber unit and/or a magnetic field generated within the low temperature pressure chamber is prevented (avoided). For example, welding of the add-on unit and or at least one retaining device for attachment of the add-on unit involves mechanical changes to the low temperature pressure chamber unit, in particular a deformation of the low temperature pressure chamber unit, and/or an unwanted magnetization of the add-on unit and/or of the retaining device that can be prevented according to the invention by the attachment of the add-on unit to the external housing of the low temperature pressure chamber unit by means of the adhesive unit. A flexible positioning for the additional add-on unit can additionally be particularly advantageously achieved, wherein the add-on unit can hereby be arranged at an arbitrary, freely selectable position at the external housing by means of the adhesive unit, and therefore independent of an arrangement of additional attachment elements that are provided for an attachment of the low temperature pressure chamber unit to a transport of said low temperature chamber unit, for example. In particular, the add-on unit can be attached in a space-saving manner by the adhesive unit, even at positions on the low temperature pressure chamber unit that previously could not be considered for space reasons, due to complicated frame designs and/or welding designs that were previously necessary. Furthermore, the attachment according to the invention can be mounted on the low temperature pressure chamber with flexible timing, for example even just before a delivery to a customer and or just after a mounting and/or installation at a customer, since a prior planning—for example given a welding of the mounting device—can be foregone. An optimal position for the add-on unit on the external housing of the low temperature pressure chamber unit thus can be established only just before a final installation, thereby avoiding the need for early planning of the position of the add-on unit on the external housing during a development phase (in which an optimal position of the add-on unit cannot yet be known) of the low temperature pressure chamber unit. Moreover, an upgrade and or an expansion—for example an improved and or new electronic unit and/or casing etc.—to an existing system, in particular to a low temperature pressure chamber unit that is installed at a customer, can be implemented with a simple design.

The attachment device according to an embodiment of the invention has at least one mounting device that is attached to the external housing by the adhesive unit and at which the at least one add-on unit is arranged. In particular given large add-on units, a simple positioning of the mounting device by the adhesive unit on the external housing of the low temperature pressure chamber unit can initially be achieved, and the add-on unit can subsequently be arranged at the mounting device.

Furthermore, in accordance with the invention, the adhesive unit can have at least one first adhesive element that embodies a pressure-sensitive adhesive, so an immediate, stable fixing between the at least one add-on unit and/or the at least one mounting device and the external housing can be achieved upon contact of the first adhesive element with the external housing and/or the at least one mounting device and/or the at least one add-on unit. The first adhesive element can have a tensile strength R of at least 0.5 N/mm$^2$ at room temperature, and preferably has a tensile strength R of at least 1.0 N/mm$^2$ at room temperature. A pressure-sensitive adhesive in this context means an adhesive that remains highly viscous and durably elastic after application thereof onto a substrate material. Pressure-sensitive adhesives can be applied on an object by pressure and then remain durably bonded to that object. Furthermore, room temperature means a temperature range of 20° C.±10° C. Tensile strength means the maximum mechanical stress that the adhesive element can accept without damage.

The first adhesive element preferably is formed as a double sided adhesive tape so that a particularly simple and fast fixing can be achieved. Preferably, the first adhesive element is flame resistant, in particular a flame resistant double-sided adhesive tape, such that a particularly high safety standard for the low temperature pressure chamber unit can additionally be ensured. For example, in the event of fire the at least one add-on unit will remain affixed as long as possible in a stable manner on the external housing. The double-sided adhesive tape preferably embodies an acrylate adhesive that, in addition to an advantageous shear resistance, also exhibits an advantageous stability with regard to unwanted peeling of the adhesive tape. A particularly high initial adhesive force and an advantageous resistance to softening are thus achieved. In addition, the adhesive tape can be designed to be at least partially elastic, such that a connection and/or attachment that damps vibrations, at least to a certain extent, can be achieved.

If the adhesive unit has at least one second adhesive element that embodies an elastic component adhesive, in addition to the function of fixing the at least one add-on unit and/or of the at least one mounting device on the external housing, it also performs the function of decoupling vibrations and/or movements between the at least one add-on unit and/or the at least one mounting device and the external housing. For example, the low temperature pressure chamber unit can experience a change in its circumference due to pressure fluctuations and/or temperature fluctuations, and these changes can be decoupled at least partially from the at least one add-on unit and/or the at least one mounting device by the second adhesive element. A secure fixing of the at least one add-on unit and/or the at least one mounting device can additionally be achieved by the second adhesive element at least partially compensating for a different thermal expansion between the external housing of the low temperature pressure chamber unit and the at least one add-on unit and/or the at least one mounting device. An elastic adhesive element means an adhesive element that is also designed for an elastic damping of vibrations and/or unwanted movements in addition to an adhesion. For this purpose, the adhesive element is preferably formed of a material with the property that its shape is altered with the external application of force but returns to its original shape upon removal of the externally applied force. In particular, upon filling of the low temperature chamber with a coolant (for example liquid helium), the external housing cools to approximately −190° C. due to temporary heat bridges, but after this filling the temperature of the external housing is at room temperature again. A secure attachment is nevertheless provided in accordance with the invention due to the elasticity of the second adhesive element, and brittleness of the adhesive element can be prevented.

The component adhesive is preferably formed as a two-component adhesive and includes a hybrid polymer adhesive, with one component including a modified silane and the additional component including a reaction accelerator and/or curing agent, and the two components are mixed with one another with a predetermined mixing ratio to form the adhesive only just before a use of the two-component adhesive. For an effective attachment on the low temperature pressure chamber, in most cases the two-component adhesive must first still cure after the application thereof to the chamber before it can be loaded. The two-component adhesive is preferably non-toxic, such that non-toxic, worldwide shipping for subsequent installation at a magnetic resonance system already in use can be achieved. As an alternative to this, the two-component adhesive can include toxic substances, for example epoxy resins. A combination of the first and second adhesive element for an attachment of the mounting device is particularly advantageous since then an immediately stable and positionally accurate fixing with a long term stability can be achieved after a curing of the second adhesive element.

For a particularly stable fixing of the at least one add-on unit and/or the at least one mounting device on the external housing at low temperatures, the second adhesive element has a tensile strength of at least 5 N/mm$^2$—preferably a tensile strength of at least 6 N/mm$^2$ and particularly preferably a tensile strength of at least 7.5 N/mm$^2$—at low temperatures of approximately −190° C. "Approximately −190° C." means a temperature of −190° C. with a tolerance range of ±25° C., preferably ±15° C., and more preferably ±10° C.

In a further embodiment of the invention, the first adhesive element and/or the second adhesive element has a tensile strength at low temperatures of approximately −190° C. that is greater by at least a factor of two than a tensile strength of the first adhesive element and/or of the second adhesive element at room temperature. A particularly secure and durable fixing can therefore be achieved in particular at low temperatures of approximately −190° C. The tensile strength of the first adhesive element and/or the second adhesive element at low temperatures of approximately −190° C. is preferably greater by a factor of 2.5 9, and more preferably by a factor of 3, than the tensile strength of the first adhesive element and/or of the second adhesive element at room temperature. Surprisingly, it has turned out that the tensile strength of the first and/or second adhesive element is greater the lower a temperature of an environment in which the piece of unit is arranged, for example in that the second adhesive element can exhibit an elastic property at room temperature and can exhibit a hard-elastic property at low temperatures of approximately −190° C.

The adhesive unit has an adhesive layer with a layer thickness, and the first adhesive element and the second adhesive element are arranged next to one another in this adhesive layer, orthogonal to this layer thickness. An immediate, stable, and in particular positionally accurate fixing of the at least one add-on unit and/or of the at least one mounting device on the external housing can hereby take place in that both adhesive elements enter into a direct adhesive bond with the external housing and the at least one add-on unit and/or the at least one mounting device. An advantageous, flexible long-term stabilization of the fixing can additionally be achieved after curing of the second adhesive element. The loading capacity and/or a stability of the fixing is dependent on the layer thickness of the adhesive layer. The smaller the design of the layer thickness, the greater and adhesive force of the adhesive layer, but its damping property is reduced such that a layer thickness of the adhesive layer from 1 mm to 6 mm has proven to be suitable to damp vibrations between the at least one add-on unit and/or the at least one mounting device and the external housing, while adhesive force is active for a stable attachment of the at least one add-on unit and/or of the at least one mounting device to the low temperature pressure chamber unit.

In a further embodiment, the adhesive unit has at least one elastic decoupling element that is arranged between the at least one add-on unit and/or the at least one mounting device and the external housing, and that has a thickness that is equal to a layer thickness of an adhesive layer of the first adhesive element and/or of the second adhesive element. An additional decoupling and/or damping of vibrations between the at least one add-on unit and/or the at least one mounting device and the external housing thus can be achieved. The decoupling element can be formed from an elastomer (for example a sylomer) and/or from the first adhesive element fashioned as a double-sided adhesive tape and or additional materials appearing to be reasonable to the man skilled in the art. The layer thickness and/or a thickness of the second adhesive element can particularly advantageously be predetermined by a thickness of the double-sided adhesive tape.

In another embodiment, the at least one mounting device has a mounting element with a curved surface, the curved surface corresponding to the curvature of an external wall of the external housing. An effective an exact adaptation of the mounting device to the external wall of the external housing thus can be achieved, and therefore a particularly stable fixing can be achieved with an adhesive layer with an essentially uniform layer thickness. The curvature of the mounting element can deviate from the curvature of the external wall of the external housing within the scope of tolerances, and these deviations and/or tolerances can be compensated by the adhesive layer.

As an alternative, the at least one mounting device can have at least two mounting elements with at least one flat surface, wherein the at least two mounting elements respectively adjoin one another on the outer wall of the external housing, wherein the two flat surfaces of the at least two mounting elements enclose an angle of less than 180° and of more than 120° relative to one another. A cost-effective production of the at least one mounting device can be achieved, and in addition an essentially custom-fit arrangement of the at least one mounting device on the low temperature pressure chamber unit can be achieved.

In a further embodiment of the invention, the at least one mounting device has at least one mounting element for an attachment of at least one add-on unit. An attachment of the add-on unit onto the low temperature pressure chamber can hereby be achieved with a simple design. The mounting element can be formed, for example, by a threaded bolt with an external threading and/or a mounting element with an internal threading and/or additional mounting elements that appear to be reasonable to those skilled in the art.

Furthermore, the invention encompasses a magnetic resonance device with a low temperature pressure chamber unit, the low temperature pressure chamber unit including a low temperature pressure chamber within which is at least one magnetic coil is supported that is cooled at least temporarily to approximately −269° C., an external housing surrounding the low temperature pressure chamber, and an attachment device as described above to mount at least one add-on unit on the external housing.

The attachment device has an adhesive unit that is provided for an arrangement and/or an attachment of the at least one add-on unit on the external housing. The at least one add-on unit can thus be mounted and/or attached on the low temperature pressure chamber even given a present magnetic field, whereby additional, significant installation dependent costs can be spared. In addition, a particularly stable and flexible attachment of the at least one add-on unit on the external housing can be achieved. In particular, a positioning adapted to different model variants and/or to the desires of a customer can be achieved.

The invention also encompasses an attachment method for the attachment of at least one add-on unit to an external housing of a low temperature pressure chamber unit.

The method according to the invention includes the step of attaching the at least one add-on unit to the external housing by an adhesive unit. The at least one additional add-on unit can be of simple design and can be arranged cost-effectively on the low temperature pressure chamber unit. In addition, a flexible positioning for the at least one additional add-on unit can particularly advantageously be achieved, because the at least one add-on unit can be arranged at an arbitrary, freely selectable position on the low temperature pressure chamber unit by the adhesive unit. In particular, the add-on unit can be placed on the chamber in a space-saving manner by the adhesive unit, even at positions on the low temperature pressure chamber unit that could previously not be considered for space reasons due to complicated frame designs and/or welding designs since, for example, many positions on the low temperature pressure chamber unit are difficult to access in a production of said low temperature pressure chamber unit. The attachment method to attach add-on units to low temperature pressure chamber units can particularly advantageously be used in magnetic resonance systems.

In an embodiment, the inventive method includes the step of cleaning regions of the external housing that are intended for contact with the adhesive unit so as to be free of contaminants before application of the adhesive unit on the external housing, so a secure and reproducible adhesion effect of the adhesive unit can be achieved. Non-toxic cleaning cloths are preferably used to clean the low temperature pressure chamber, such that a retrofitting of mounting devices to low temperature pressure chamber is already in operation can take place worldwide without any problems.

In a further embodiment of the method, before attaching the adhesive unit, a template (stencil) is arranged on the chamber to determine an exact position of the adhesive unit. The adhesive unit can be applied particularly exactly on the external housing with a simple design by means of the template. A subsequent installation of the at least one add-on unit and/or at least one mounting device on the external housing at an operating location and/or installation site of the low temperature pressure chamber unit (in particular a magnetic resonance device with the low temperature pressure chamber unit) is also possible. For this purpose, the template is designed with a surface that has a high degree of static friction (stiction), such that the template can independently remain stuck (but removably so) to the external housing and a simple and cost-effective mounting can be achieved. For example, an upgrade of an existing low temperature pressure chamber unit (in particular of a low temperature pressure chamber unit in a magnetic resonance system) can be implemented with little effort and low cost, in particular a subsequent attachment of a casing etc.

In an embodiment of the attachment method, a first adhesive element of the adhesive unit is attached to the at least one add-on unit and/or the at least one mounting device in a first adhesion step, and in a second adhesion step a second adhesive element of the adhesive unit (that has a different design than the first adhesive element) is applied onto the at least one add-on unit and/or the at least one mounting device next to the first adhesive element, and subsequently the at least one add-on unit and/or the at least one mounting device is affixed. Due to the different adhesive elements, tools and/or materials with different coefficients of thermal expansion can hereby be flexibly affixed to one another, for example the add-on unit and/or the mounting device made from an aluminum material to the external housing made of a stainless steel material. An immediate, stable and positionally accurate fixing with a flexible, long-term stability of the at least one add-on unit and/or the at least one mounting device on the external housing can hereby additionally be achieved after curing of the second adhesive element.

In accordance with the inventive method, the at least one add-on unit is arranged on the at least one retention unit after curing of the adhesive unit, so a particularly stable and secure positioning of the add-on unit on the low temperature pressure chamber unit is achieved.

In the attachment method, the attachment of the at least one add-on unit and/or of the at least one mounting device to the external housing can particularly advantageously be implemented on site at a customer system, such that in particular upgrades or retrofittings can be installed on site retroactively to an existing system at the customer in order to additionally arrange such further add-on units on the low temperature pressure chamber unit.

The attachment of the at least one add-on unit and/or the at least one mounting device to the external housing takes place in a magnetic field produced by at least one magnetic coil that is arranged inside the low temperature pressure chamber. A particularly cost-effective and time-saving attachment can be achieved since a complicated shutdown of the magnetic field and the subsequent re-establishment thereof are not necessary (as must take place in order to conduct welding of the at least one add-on unit and/or the at least one mounting device to the external housing and/or spot-drilling of reinforcement rings of the external housing).

DESCRIPTION OF THE PREFERRED EMBODIMENTS

Figure 1:
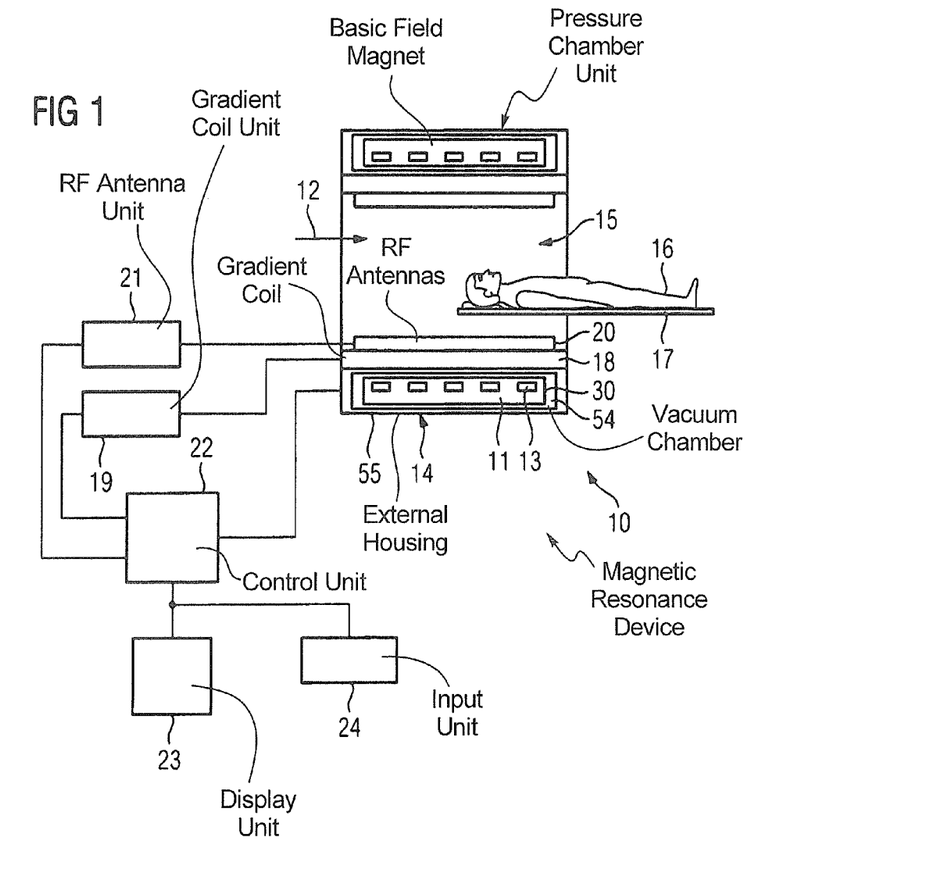
FIG. 1 schematically illustrates a magnetic resonance device with a low temperature pressure chamber unit according to the invention.

A magnetic resonance device 10 according to the invention is shown in FIG. 1. The magnetic resonance device 10 has a basic magnet 11 to generate a strong and in particular constant basic magnetic field 12. To generate the basic magnetic field 12, the basic field magnet 11 includes superconducting magnetic coils 13 that are arranged within a low temperature pressure chamber unit 14. The superconducting magnetic coils 13 are cooled to approximately −269° C. in operation of the magnetic resonance device 10. In addition, the magnetic resonance device 10 has a cylindrical acquisition region 15 to accommodate a patient 16, wherein the acquisition region is surrounded by the basic magnet 11 in a circumferential direction. The patient 16 can be moved into the acquisition region 15 by a patient bed 17 of the magnetic resonance device 10.

The magnetic resonance device 10 furthermore has a gradient coil 18 to generate magnetic field gradients that are used for a spatial coding during an imaging. The gradient coil 18 is controlled by means of a gradient coil unit 19. Furthermore, the magnetic resonance device 10 has radio-frequency (RF) antennas 20 and a radio-frequency antenna unit 21 to excite a polarization that arises in the basic magnetic field 12 generated by the basic field magnet 11. The radio-frequency antennas 20 are controlled by the radio-frequency antenna unit 21 and radiate radio-frequency magnetic resonance sequences into an examination space that is essentially formed by the acquisition region 15. The magnetization is deflected out of its steady state. In addition to this, magnetic resonance signals are received by means of the radio-frequency antenna unit 21.

The magnetic resonance device 10 has a control unit 22 to control the basic field magnet 11, the gradient coil unit 19 and the radio-frequency antenna unit 21. The control unit 2 centrally controls the magnetic resonance device 10, for example the implementation of a predetermined imaging gradient echo sequence. Control information—for example imaging parameters—as well as reconstructed magnetic resonance images can be displayed at a display unit 23 of the magnetic resonance device 10. In addition, the magnetic resonance device 10 has an input unit 24 that allows information and/or parameters to be entered by an operator during a measurement (data acquisition) procedure.

The shown magnetic resonance device 10 can naturally include additional components that are customarily present in magnetic resonance systems. The general function of the magnetic resonance device 10 is known to those skilled in the art, such that a detailed description of the general components is not necessary herein.

Figure 2:
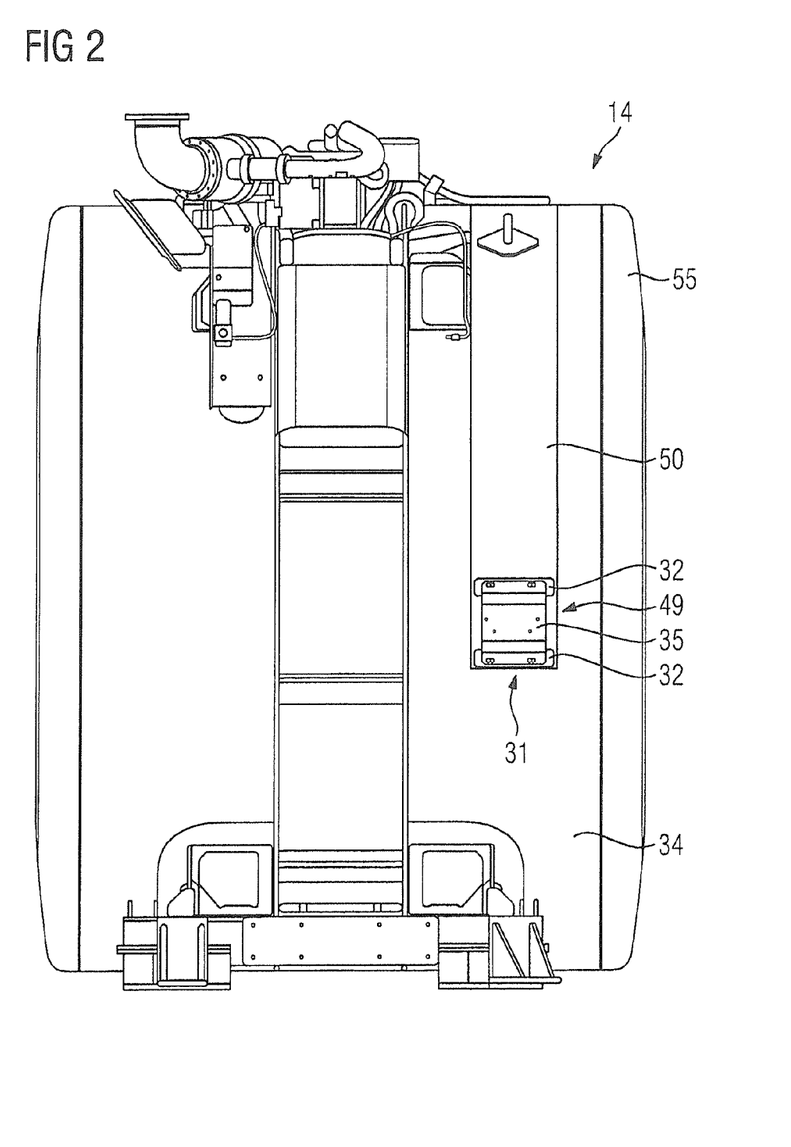
FIG. 2 schematically illustrates the low temperature pressure chamber unit with the attachment device.

A low temperature pressure chamber unit 14 of the magnetic resonance device 10 is shown in detail in FIG. 2. The low temperature pressure chamber unit 14 has a low temperature pressure chamber 30 (a vacuum chamber 54), wherein the low temperature pressure chamber 30 is arranged within the vacuum chamber 54. Furthermore, the low temperature pressure chamber unit 14 has an external housing 55 surrounding the vacuum chamber 54 and an attachment device 31. The attachment device 31 has a mounting device 32 as this is shown in detail in FIG. 3 through 5. To attach the mounting device 32 on the external housing 55, the attachment device 31 has an adhesive unit 33 that is arranged between an external wall 34 of the external housing 55 and the mounting device 32. Add-on units 35 (for example casing modules and/or retaining clips and/or cable guide elements etc.) can be arranged at a desired location and/or at a desired position on the low temperature pressure chamber 30 by the mounting device 32. In addition to this, it is also conceivable to attach the add-on unit directly to the external housing 55 by the adhesive unit 33.

Superconducting magnetic coils 13 of the basic field magnet 11 that are cooled to approximately −269° C. to generate the basic magnetic field 12 are borne in the low temperature pressure chamber 30. Under normal conditions, the external wall 34 of the external housing 55 has a temperature of the environment (room temperature, for example). However, if the low temperature pressure chamber 30 is filled with liquid helium, for example, the temperature of the external housing 55 drops to a temperature of approximately −190° C. to approximately −200° C. in this region due to heat bridges between the external housing 55 and the low temperature pressure chamber 30. The adhesive unit 33 must therefore have properties with a high adhesion force over a large temperature range that is between approximately −200° C. and approximately +25° C. without thereby becoming brittle.

Figure 4:
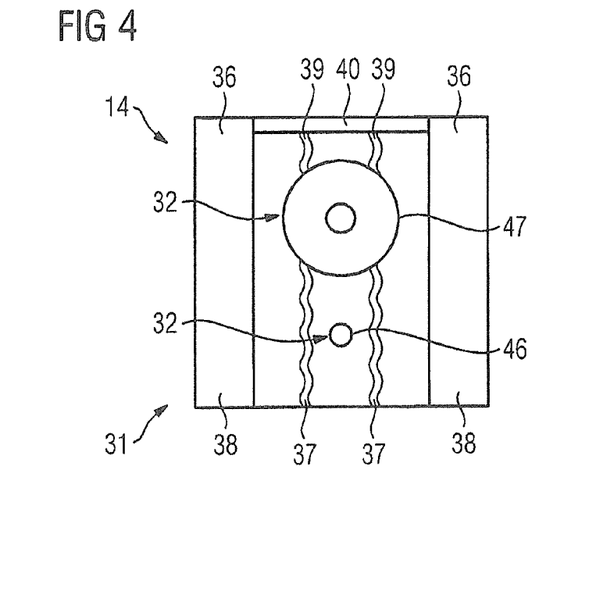
FIG. 4 schematically shows an arrangement of adhesive elements of the attachment device.
Figure 6:
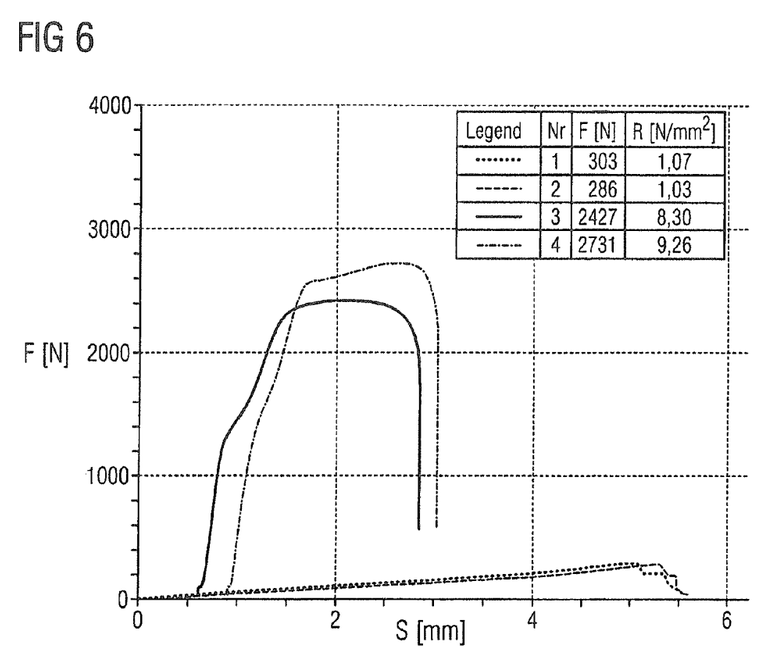
FIG. 6 is a graph showing tensile strength for various temperature ranges of a first adhesive element.

The adhesive unit 33 has a first adhesive element 36 and a second adhesive element 37 (FIG. 4). The first adhesive element 36 comprises an adhesive glue and is formed by a double-sided adhesive tape 38, wherein the double-sided adhesive tape 38 is additionally designed to the be flame-resistant so that a subsequent installation of the attachment device 33 at the external housing 44 is possible worldwide while complying with high safety standards at a customer. The double-sided adhesive tape 38 has a tensile strength R of at least 0.5 $N/mm^2$—and particularly advantageously a tensile strength R of 1 $N/mm^2$—at room temperature. In contrast to this, at low temperatures of approximately −190° C. the tensile strength R of the first adhesive element 36 has a value that is greater by a factor of 2 than the value of the tensile strength R of the first adhesive element 36 at room temperature. At low temperatures of approximately −190° C., the tensile strength R of the double-sided adhesive tape 38 thus has a value of at least 1 $N/mm^2$, preferably of at least 2 $N/mm^2$. In the present exemplary embodiment, a double-sided adhesive tape 38 is used that has a tensile strength R of approximately 8-9 $N/mm^2$ at low temperatures of approximately −190° C. For this, in FIG. 2 an expansion force F acting on the double-sided adhesive tape 38 is plotted in N over an expansion distance s in mm of the double-sided adhesive tape 38, wherein the dotted and dashed lines represent two measurement series at room temperature, together with the solid line and the dash-dot line that represent two measurement series at a temperature of approximately −190° C. In addition, in FIG. 6 the tensile strength for the 4 measurement series is shown in tabular form together with the expansion force F.

In the present exemplary embodiment the double-sided adhesive tape 38 is formed by a double-sided adhesive tape 38 based on acrylate.

Figure 7:
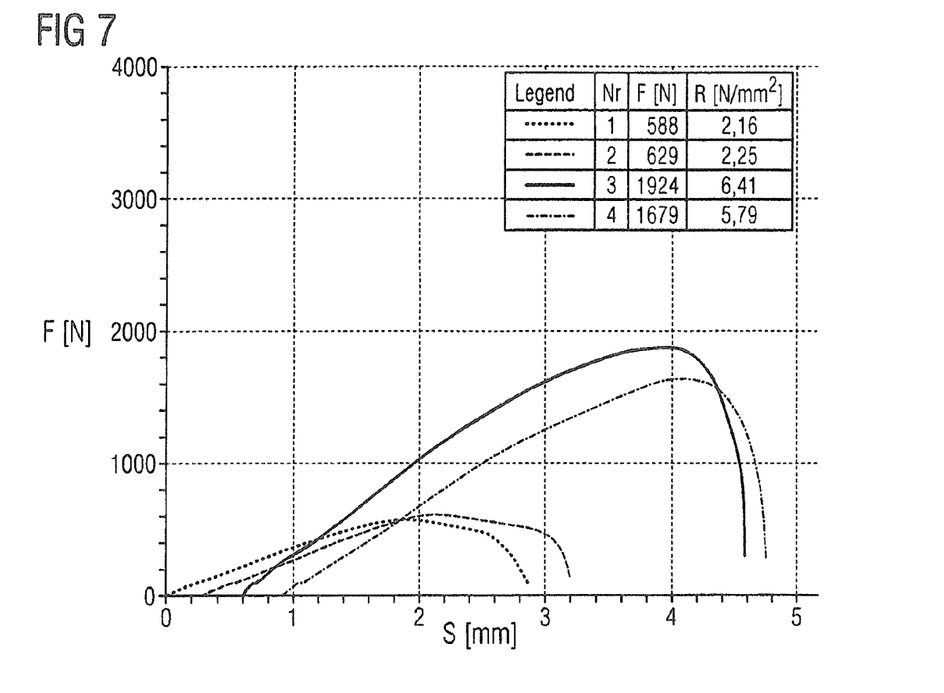
FIG. 7 is a graph showing tensile strength for various temperature ranges of a second adhesive element.

The second adhesive element 37 of the adhesive unit 33 is formed by an elastic component adhesive 39 that, in the present exemplary embodiment, is formed by a two-component adhesive 39. At low temperatures of approximately −190° C., second adhesive element 27 has a tensile strength R with a value of at least 5 $N/mm^2$, and particularly preferably of at least 6 $N/mm^2$. In the present exemplary embodiment, a two-component adhesive 39 is used that has a tensile strength R of up to 5-6 $N/mm^2$ at low temperatures of approximately −190° C. (see FIG. 7 in this regard). The tensile strength R of the second adhesive element 37 is shown in detail in FIG. 7. For this, in FIG. 7 an expansion force F acting on the two-component adhesive 39 is plotted in N over the expansion distance s in mm of the two-component adhesive 39, wherein the dotted and dashed lines represent two measurement series at room temperature and the solid line together with the dot-dash line represent two measurement series at a temperature of approximately −190° C. At low temperatures of approximately −190° C., the two-component adhesive 39 has a tensile strength R that is greater by at least a factor of 2 than a tensile strength R of the two-component adhesive 39 at room temperature. In the present exemplary embodiment, the tensile strength R of the two-component adhesive 39 is approximately 2 $N/mm^2$ at room temperature. In addition to this, in FIG. 7 the tensile strength for the 4 measurement series is shown in tabular form together with the expansion force F.

The two-component adhesive 39 is formed from two components that are advantageously mixed with one another in a predetermined mixture ratio into an adhesive compound just before an adhesion process, as this can be realized automatically, for example, by means of a mixing tube of a cartridge to accommodate the adhesive unit 33. The two-component adhesive 39 advantageously contains no content substances comprising polyurethane. In the present exemplary embodiment, the two-component adhesive 39 is formed by a hybrid polymer adhesive with a modified silane material, wherein a first component of the two-component adhesive 39 includes the modified silane material and a second component of the two-component adhesive 39 includes a reaction accelerator and/or a curer. The two-component adhesive 39 is additionally designed such that it has a vibration-damping effect. In an alternative embodiment of the second adhesive element 37, this can also be formed by a single-component adhesive.

Furthermore, the adhesive unit 33 comprises an elastic decoupling element 40 (FIG. 3) that, in an installed position, is arranged between the external wall 34 of the external housing 55 and the mounting device 32. The elastic decoupling element 40 is advantageously formed from a sylomer and/or additional elastic materials that appear to be reasonable to the man skilled in the art. The elastic spacer element 40 hereby has external surfaces coated with an adhesive glue material in order to attach the elastic decoupling element 40 to the external wall 34 of the low temperature pressure chamber unit 14 and/or to the mounting device 32. In an alternative embodiment of the invention, the adhesive unit 33 can include only the two adhesive elements 36, 37, and the elastic decoupling element 40 can be omitted, and/or the elastic decoupling element 40 can be formed by the double-sided adhesive tape 38.

Figure 3:
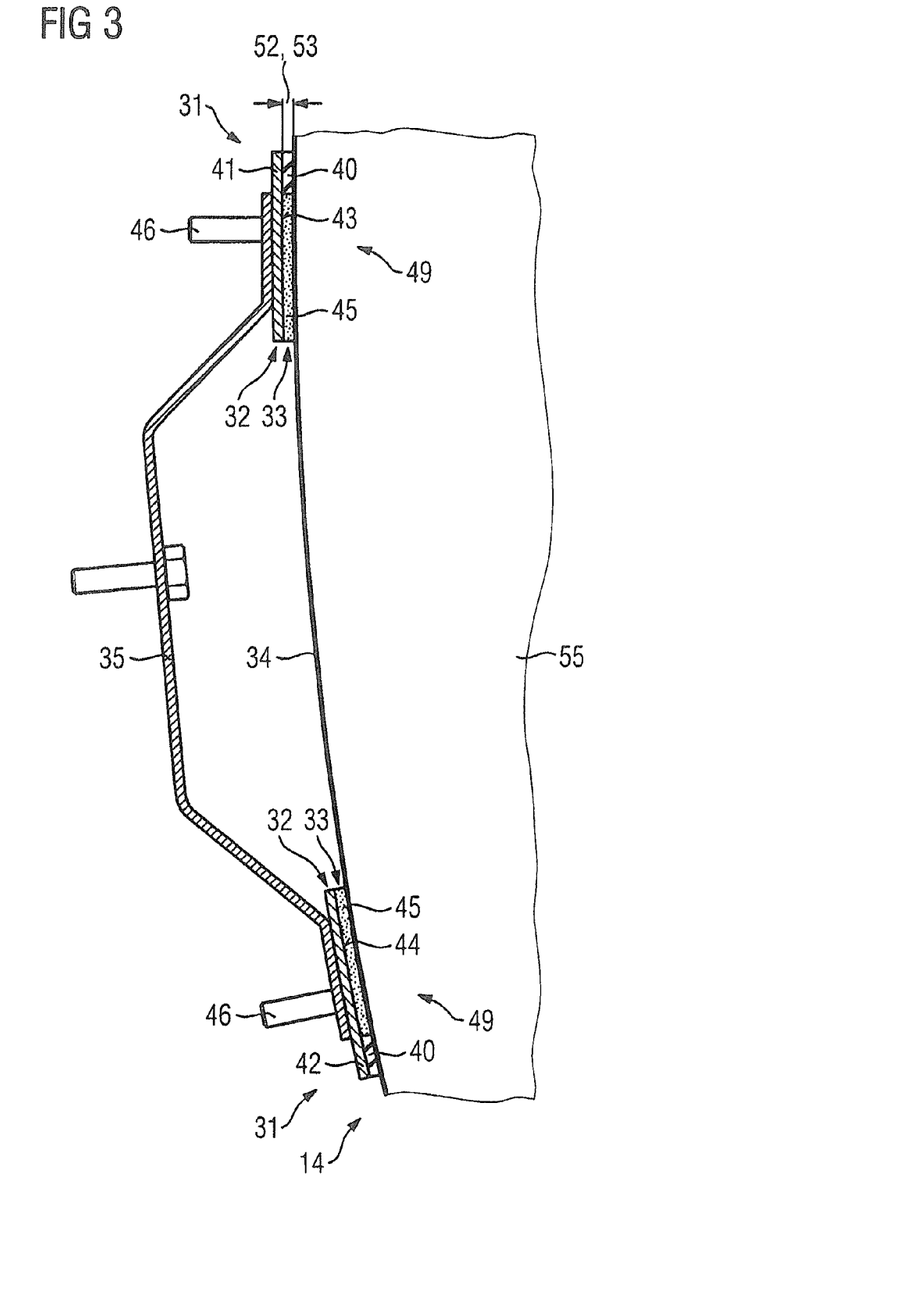
FIG. 3 shows a portion of a region of the low temperature pressure chamber unit with the attachment device, in section.

In FIG. 3 the low temperature pressure chamber unit 14 is shown with two mounting devices 32. The two mounting devices respectively have a mounting element 41, 42 that adjoins a respective adhesive unit 33. A first of the two mounting devices 32 comprises the mounting element 41 that has a straight surface 43 for an application on the adhesive unit. The other of the two mounting devices 32 comprises the mounting element 42 that has a curved surface 44 for an application on the adhesive unit 33. The curved surface 44 of the mounting element 42 has a curvature that corresponds to a curvature of the external wall 34 of the external wall 55, such that a custom-fit attachment with a uniform adhesive layer 45 is achieved between the mounting device 32 and the external housing 55. As an alternative to this, the curved mounting element 42 can also have a curved execution. In an installed position, the straight surface 43 of the mounting element 41 and the curved surface 44 of the mounting element 42 are facing toward the external wall 34 of the external housing 55.

As an alternative, the mounting device 56 can have a segmented surface 57 that is formed from three mounting elements 58, 58, 60. The three mounting elements 58, 59, 60 are fashioned in one piece and with a respective flat surface 61, 62, 63 that rests in an attached position on the external housing 55 of the low temperature pressure chamber unit 14. Two respective mounting elements 58, 59, 60 that are directly adjacent to one another have flat surfaces 61, 62, 63 that enclose an angle relative to one another that is less than 180° and greater than 120°. The functionality of the mounting device 56 on the external housing 55 in FIG. 5 corresponds to the arrangement on the external housing 55 and the functionality of the mounting device already explained in FIGS. 2 through 4.

Figure 5:
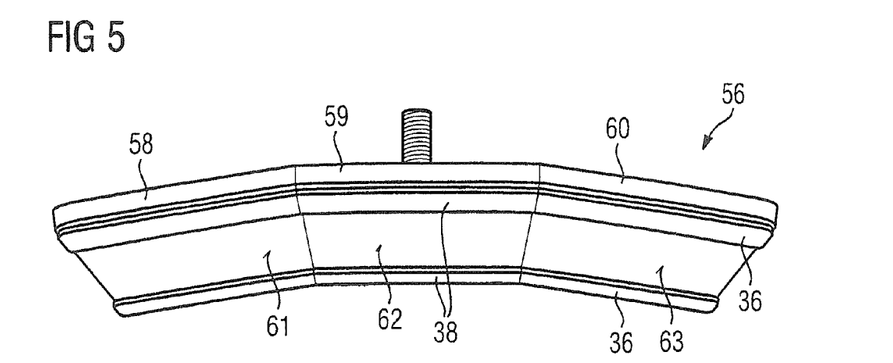
FIG. 5 shows an alternative embodiment of a mounting device of the low temperature pressure chamber unit.

The mounting devices 32, 56 also include at least one additional mounting element 46, 47 that is provided for an attachment of at least one add-on unit 35 to the mounting devices 32, 56. In FIGS. 3 and 5, the mounting devices 32, 56 have an additional mounting element 46 that is respectively formed by a threaded bolt with an outer threading. For this, the add-on unit 35 is advantageously designed such that this has a recess to accommodate the threaded bolt, for example. In the FIG. 4, the mounting device 32 has two additional mounting elements 46, 47, wherein one of the two additional mounting elements 46 is formed by a threaded bolt with an outer threading and the other of the two additional mounting elements 47 is provided with an inner threading. The additional mounting elements 46, 47 of a mounting device 32, 56 are respectively fashioned in one piece with the mounting element 41, 42, 58, 59, 60 that rests on the adhesive unit 33, wherein the additional mounting element 46, 47 can be riveted, welded etc. with the mounting element 41, 42, 58, 59, 60, for example, and/or the additional mounting element 46, 47 can be fashioned in one piece with the mounting element 41, 42, 58, 59, 60 by means of an insert nut. The additional mounting elements 46, 47 are respectively arranged on a side of the mounting devices 32, 56 that faces away from the external housing 55. In an alternative embodiment of the mounting device 32, 56, these can also have additional mounting elements 46, 47 for the attachment of the add-on units 35 or more than one mounting element 41, 42 for application on the adhesive unit 33. In addition, it is possible for the embodiment of the individual mounting elements 41, 42, 46, 47 to deviate from the exemplary embodiment shown here.

Figure 8:
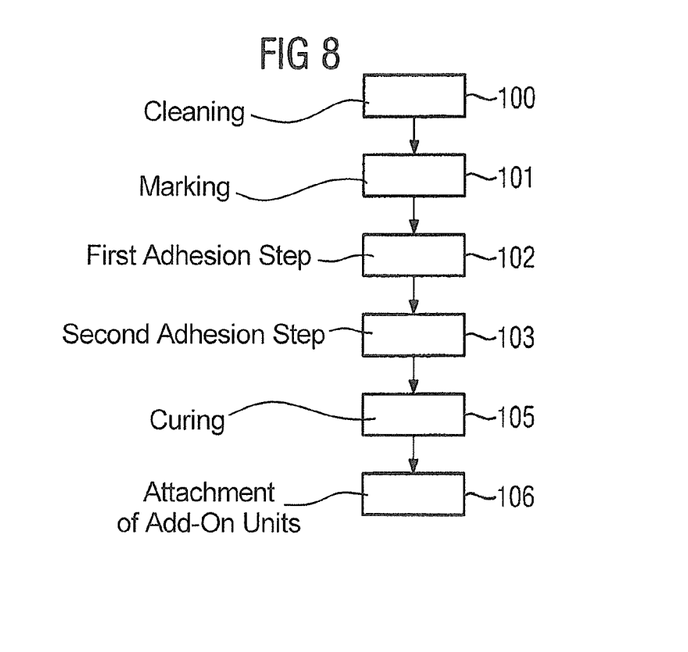
FIG. 8 is a flowchart of the basic steps of the attachment method according to the invention.

For attachment of the mounting device 32 to the external housing 55, in a cleaning step 100 of an attachment method according to the invention (FIG. 8) a region 49 of the external wall 34 of the external housing 55 at which the mounting device 32, 56 should be arranged and that makes contact with the adhesive unit for the attachment is initially cleaned of oil residues and additional contaminants (such as dust) by means of cleaning tissues. The cleaning tissues are advantageously free of contents that contain dangerous substances such as alcohol and/or cleaning products such as paraffin and/or oleum (fuming sulfuric acid) etc., since these substances would reduce the adhesion forces acting between the adhesive unit 33 and the external housing 55.

In a further marking step 101 of the method, a template 50 of the attachment device 31 is subsequently applied to the region 49 of the external housing 55. The template 50 (FIG. 2) is hereby made of a material with a high coefficient of friction for example a template 50 made of polyurethane film, a silicone film, and EPDM film etc., such that a large amount of static friction acts between the external wall 34 of the external housing 55 and the template 50, and the template 50 independently remains stuck to the external housing 55 after placement on this. The template 50 has recesses (not shown in detail) that establish an exact position of the mounting device 32, 56 on the external housing 55 and are provided to accommodate the mounting device 32, 56 together with the first and/or the second adhesive element 36, 37. As an alternative to this, the position of the mounting device 32, 56 that is indicated by means of the template 50 can also be marked on the external housing.

To position the template 50, it is aligned on the external housing 55 such that the recesses of the template 50 precisely uncover the region 49 of the external wall 34 that is provided for the attachment with the mounting device 32, 56. As an alternative to a marking 101 of the template 50 on the external housing 55, an exact position for the mounting device 32, 56 can also be measured out, for example by means of a laser marker or a laser projection system etc.

After the placement and marking 101 of the template 50 on the external housing 55, in a first adhesion step 102 the two-component adhesive 39 is initially applied on the mounting device 32, 56. The double-sided adhesive tape 38 and—insofar as it is present—the elastic decoupling element 40 are already arranged on the mounting device 32, 56, wherein the mounting device 32, 56 is already produced or delivered in a populated state. The double-sided adhesive tape 38 is applied on respective opposite edge regions of the mounting element 41, 42, 58, 59, 60, wherein the double-sided adhesive tape 38 is adhered along a complete longitudinal extent of the mounting element 41, 42, 58, 59, 60. In the first adhesion step, the two-component adhesive 39 is applied between two regions with the double-sided adhesive tape 38, wherein the two-component adhesive 39 is hereby applied by means of a cartridge, for example in the form of two or more longitudinal strips. An automatic mixing of the two-component adhesive 39 takes place by means of the cartridge before the application of said two-component adhesive 39. An adhesive compound of the two-component adhesive 39 is thereby applied transversal to the layer thickness 53 of the adhesive layer 45, next to the double-sided adhesive tape 38 on the mounting element 41, 42, 58, 59, 60. The first and second adhesive element are thereby attached to straight surface 43 of the mounting element 41 and/or to the curved surface 44 of the mounting element 44 of the mounting element 42 and/or to the segmented surface 61, 62, 63 of the mounting elements 58, 59, 60.

The thickness 52 of the elastic spacer element 40 or the thickness of the second adhesive element 36 thereby corresponds to a layer thickness 53 of the adhesive layer 45 of the adhesive unit 33 that is formed by the double-sided adhesive tape 38 and the two-component adhesive 39. Insofar as a tape thickness of the double-sided adhesive tape 38 is thinner than a thickness 52 of the elastic spacer element 40 or is thinner than a layer thickness 53 of the adhesive unit 33, at least two or more layers of the double-sided adhesive tape 38 are glued to one another along the layer thickness 53. Given an adhesive tape that is 3 mm thick, for example, the layer thickness 53 of the adhesive layer 45 can be 3 mm or 6 mm.

In a second adhesion step 103, the mounting device 32, 56 is arranged together with the two adhesive elements 36, 37 within the recess of the template 50. The adhesive unit 33 is mounted in registration on the external wall 34 of the external housing 55 by means of the template 50. The template 50 is removed from the external housing 55 after application of the adhesive unit 33. The mounting elements 41, 42, 58, 59, 60 are thereby arranged with the surface 43, 44, 61, 62, 63 having the first and/or the second adhesive element 36, 37 on the external housing 55 of the low temperature pressure chamber unit 14. Because the straight surface 43 of the mounting element 41, or the curved surface 44 of the mounting element 42, has the same curvature as a curvature of the region 49 of the low temperature pressure chamber 30, a uniformly thick layer thickness 53 of the adhesive layer 45 can be achieved, and concurrently with this a uniform, constant static friction for the attachment of the mounting devices 32, 56 on the low temperature pressure chamber 30. In addition to this, a uniform, even vibration decoupling is hereby achieved between the mounting devices 32, 56 and the low temperature pressure chamber 30.

By means of the segmented surface 57 of the mounting elements 58, 59, 60, these mounting elements 58, 59, 60 rest tangential to the external wall 34 of the external housing 55 and have a maximum clearance from the external housing 55 at contact points of the mounting elements 58, 59, 60 with one another. An effective attachment due to the adhesive effect of the first and second adhesive element 36, 37 is provided at the tangential contact points. In contrast to this, in the regions with the maximum clearance an adhesion effect is achieved via the second adhesive element 37, which given an application on the mounting element 41, 42, 58, 59, 60 is applied thicker than a layer thickness 53 of the adhesive layer 45. For example, the second adhesive element 37 can be applied with twice the thickness of the layer thickness 53 on the mounting elements 41, 42, 58, 59, 60. In the second adhesion step 103, the second adhesive element 37 is pressed at a maximum thickness (which is equal to the layer thickness 53) in the region of the contact points due to a contact pressure that acts on the mounting device 32, 56, wherein a width of the second adhesive element 37 increases.

In addition to the elastic decoupling element 40, the first adhesive element 36 and particularly advantageously the second adhesive element 37 also have vibration-damping properties, such that relative movements between the mounting devices 32, 56 and the low temperature pressure chamber unit 30 that are caused by different coefficients of thermal expansion in the different materials are advantageously compensated. The layer thickness 53 of the adhesive layer 45 can be designed for the attachment device 31, depending on the requirements for an adhesion property and a damping property. The thicker the layer thickness 53 of the adhesive layer 45, the more strongly pronounced the damping properties of the adhesive layer 45. At the same time, the adhesive properties of the adhesive layer 45 for an attachment of the mounting devices 32, 56 on the external housing 55 decrease. It applies in reverse that, the thinner the layer thickness 53 of the adhesive layer 45, the more strongly pronounced the adhesion properties of the adhesive layer 45. At the same time, however, the damping properties of the adhesive layer 45 decrease. In the exemplary embodiment, the layer thickness 53 amounts to approximately 1 mm to 6 mm, since both sufficiently large damping properties and sufficiently large adhesion properties of the adhesive layer 45 are achieved. For a maximum decoupling, the layer thickness 53 can be up to 10 mm.

An immediate and in particular positionally accurate attachment of the mounting devices 32, 36 on the external housing 55 is achieved by means of the first adhesive element 36, wherein an unwanted position change during a curing process is advantageously prevented via the design of the first adhesive element 36 as a double-sided adhesive tape 38. For the second adhesive element 37, a curing phase 105 in which the adhesive compound of the second adhesive element 37 cures follows the second adhesion step 103. After this curing phase 105, the second adhesive element 37 has the full extent of its adhesive properties and damping properties. After the curing phase 105, at low temperatures (of approximately −160° C. to approximately −200° C.) the attachment device 31 has a load capacity that corresponds to approximately 7-8 times a load capacity of the attachment device 31 at room temperature. For example, the load capacity of the attachment device 31 shown in FIG. 4 amounts to approximately 500 kg at room temperature, and a load capacity of approximately 4000 kg [sic] at a temperature of approximately −160° C. to approximately −200° C.

After the second adhesion step 103 and after the curing phase 105, the add-on units 35 are bolted onto the mounting devices 32, 56 (in particular to the additional mounting elements 46, 47) in an attachment step 106. As an alternative to this, instead of attaching mounting devices 32, 56 to the low temperature pressure chamber unit 14, the attachment method can be executed for the direct attachment or gluing of the add-on units 35 to the external housing 55. A series of individual method steps is thereby the same as in the attachment of the mounting devices 32, 56 to the external housing 55, wherein the attachment step 106 can be omitted.

Due to the simplified attachment method for the attachment of the mounting devices 32, 56 to the external housing 55, this attachment method can even be implemented on site at a customer for retroactive installation of the mounting devices 32, 56 together with the add-on units 35 at the external housing 55. Furthermore, for this it is not necessary that the magnetic field 12 generated in the low temperature pressure chamber 30 be shut down or deactivated and reestablished after the installation. Rather, the attachment method according to the invention is even suitable for an installation at the external housing 55 in an existing and/or maintained magnetic field 12.

Although modifications and changes may be suggested by those skilled in the art, it is the intention of the inventors to embody within the patent warranted hereon all changes and modifications as reasonably and properly come within the scope of their contribution to the art.

We claim as our invention:

1. A low temperature pressure chamber unit, comprising:
   a low temperature pressure chamber;
   an external housing surrounding said low temperature pressure chamber; and
   an attachment device comprising an adhesive unit configured to adhesively hold said attachment device to said external housing at a selectable location on said external housing, and said attachment device being configured to interact with at least one add-on unit to retain said add-on unit at said selected location on said external housing.

2. A low temperature pressure chamber unit as claimed in claim 1 wherein said adhesive unit comprises at least one first adhesive element comprising an adhesive substance.

3. A low temperature pressure chamber unit as claimed in claim 2 wherein said first adhesive element has a tensile strength of at least 0.5 N/mm$^2$ at room temperature.

4. A low temperature pressure chamber unit as claimed in claim 2 wherein said first adhesive element comprises a double-sided adhesive tape.

5. A low temperature pressure chamber unit as claimed in claim 2 wherein said adhesive unit comprises at least one second adhesive element that comprises an elastic component adhesive.

6. A low temperature pressure chamber unit as claimed in claim 5 wherein said second adhesive element has a tensile strength of at least 5 N/mm$^2$ at low temperatures of approximately −190° C.

7. A low temperature pressure chamber unit as claimed in claim 1 wherein said adhesive device comprises a first adhesive element comprising an adhesive substance, and a second adhesive element that comprises an elastic component adhesive, and wherein one of said first adhesive element or said second adhesive element has a tensile strength at low temperatures of −190° C. that is greater by at least a factor of 2 than a tensile strength at room temperature of the other of said first adhesive element and said second adhesive element.

8. A low temperature pressure chamber unit as claimed in claim 1 wherein said adhesive unit comprises a first adhesive element comprising an adhesive substance, and a second adhesive element comprising an elastic component adhesive, said first and second adhesive elements being located in a common adhesive layer having a layer thickness, said first and second adhesive elements being located next to each other in said adhesive layer, perpendicular to said layer thickness.

9. A low temperature pressure chamber unit as claimed in claim 1 wherein said adhesive unit comprises at least one elastic decoupling element located between said at least one mounting device and said external housing, said at least one elastic decoupling element having a thickness equal to said layer thickness of said adhesive layer.

10. A low temperature pressure chamber unit as claimed in claim 1 wherein said external housing comprises an external wall having a wall curvature, and wherein said at least one mounting device comprises a mounting element having a curved surface with a surface curvature corresponding to said wall curvature.

11. A low temperature pressure chamber unit as claimed in claim 1 wherein said external housing comprises an external wall, and wherein said at least one mounting device comprises at least two mounting elements each having a flat surface, said at least two mounting elements being located next to each other on said external wall of said external housing, with the respective flat surfaces of said at least two mounting elements enclosing an angle that is less than 180° and greater than 120°.

12. A low temperature pressure chamber unit as claimed in claim 1, comprising a mounting device between said adhesive unit and said add-on unit.

13. A low temperature pressure chamber unit as claimed in claim 12 wherein said at least one mounting device comprises at least one mounting element having a mechanical configuration for attachment to said add-on unit.

14. A magnetic resonance apparatus comprising:
  a magnetic resonance data acquisition unit comprising a superconducting basic field magnet that generates a static basic magnetic field in an examination volume within said data acquisition unit;
  a low temperature pressure chamber;
  an external housing surrounding said low temperature pressure chamber;
  an add-on unit; and
  an attachment device comprising an adhesive unit configured to adhesively hold said attachment device to said external housing at a selectable location on said external housing, and configured to interact with at least one add-on unit to retain said add-on unit at said selected location on said external housing.

15. A method to attach at least one add-on unit to an external housing of a low temperature pressure chamber unit, said method comprising:
  adhesively affixing an attachment device to said external housing at a selectable location on said external housing; and
  mounting said add-on unit to said adhesive device to retain said add-on unit at said selected location on said external housing.

16. A method as claimed in claim 15 comprising cleaning a region encompassing said selected location of impurities before attaching said adhesive unit to said external housing at said selected location.

17. A method as claimed in claim 15 comprising before attaching said adhesive unit to said external housing, designating said selected location by temporarily applying a template to said external housing that comprises an indication of said selected location, and attaching said adhesive unit to said external housing at the selected location according to said indication in said template.

18. A method as claimed in claim 15 comprising:
  providing said attachment unit with at least one first adhesive element and at least one second adhesive element, said first and second adhesive elements having respectively different adhesive compositions and properties;
  adhering said at least one first adhesive element to said add-on unit in a first adhesion step;
  applying said second adhesive element to said external housing of said low temperature pressure chamber unit in a second adhesive step; and
  affixing said add-on unit to said external housing with said first and second adhesive elements next to each other between said external housing and said add-on unit.

19. A method as claimed in claim 15 comprising:
  providing said attachment unit with at least one first adhesive element and at least one second adhesive element, said first and second adhesive elements having respectively different adhesive compositions and properties;
  adhering said at least one first adhesive element to said external wall of said low temperature pressure chamber unit in a first adhesion step;
  applying said second adhesive element to said external housing of said low temperature pressure chamber unit in a second adhesive step; and
  affixing said add-on unit to said external housing with said first and second adhesive elements next to each other between said external housing and said add-on unit.

20. A method as claimed in claim 15 comprising:
  forming said attachment unit with an adhesive unit and a mounting device configured to interact with said add-on unit;
  forming said adhesive unit of at least one first adhesive element and at least one second adhesive element, said first and second adhesive elements having respectively different adhesive compositions and properties;
  adhering said at least one first adhesive element to said mounting device in a first adhesion step;
  applying said second adhesive element to said external housing of said low temperature pressure chamber unit in a second adhesive step; and
  affixing said add-on unit to said external housing with said first and second adhesive elements next to each other between said external housing and said add-on unit.

21. A method as claimed in claim 20 wherein said low temperature pressure chamber unit is located at an installation site, and comprising attaching said mounting device to said external wall of said low temperature pressure chamber unit at said installation site.

22. A method as claimed in claim 20 wherein said low temperature pressure chamber unit contains a superconducting magnet that generates a magnetic field, and comprising attaching said mounting device at said selected location on said external wall of said low temperature pressure chamber while said magnetic field is being generated.

23. A method as claimed in claim 15 wherein said adhesive unit comprises an adhesive requiring curing, and placing said at least one add-on unit at said selected location on said external wall after a curing period of said adhesive unit.

24. A method as claimed in claim 15 wherein said low temperature pressure chamber unit is located at an installation site, and comprising attaching said add-on unit to said external wall of said low temperature pressure chamber unit at said installation site.

25. A method as claimed in claim 15 wherein said low temperature pressure chamber unit contains a superconducting magnet that generates a magnetic field, and comprising attaching said add-on unit at said selected location on said external wall of said low temperature pressure chamber while said magnetic field is being generated.

* * * * *